(12) United States Patent
Ranmuthu et al.

(10) Patent No.: US 6,532,127 B1
(45) Date of Patent: Mar. 11, 2003

(54) DIFFERENTIAL VOLTAGE BIAS, VOLTAGE SENSE PREAMPLIFIER ARCHITECTURE

(75) Inventors: Indumini W. Ranmuthu, Plano, TX (US); Yuji Isobe, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/714,412

(22) Filed: Nov. 16, 2000

(51) Int. Cl.$^7$ ................................................. G11B 5/03
(52) U.S. Cl. ........................................................ 360/66
(58) Field of Search .................................. 330/252, 259, 330/267, 273, 136, 96; 327/538; 360/66, 67, 46

(56) References Cited

U.S. PATENT DOCUMENTS 6,222,415 B1 * 4/2001 Umeyama et al. ............ 360/67
6,252,735 B1 * 6/2001 Chung et al. .................. 360/67

* cited by examiner

*Primary Examiner*—Alan T. Faber
(74) *Attorney, Agent, or Firm*—W. Daniel Swayze, Jr.; W. James Brady; Frederick J. Telecky, Jr.

(57) ABSTRACT

A differential circuit to read differential data from a disk by a voltage bias includes a read circuit to read the differential data from the disk by maintaining the voltage bias and a feedback circuit to sense deviations in the voltage and to adjust the voltage in response to the deviations.

14 Claims, 2 Drawing Sheets

DIFFERENTIAL VOLTAGE BIAS, VOLTAGE SENSE PREAMPLIFIER ARCHITECTURE

FIELD OF THE INVENTION

The present invention relates to disk circuits and, more particularly, to a method and apparatus for reading information from a magnetic disk.

BACKGROUND OF THE INVENTION

Conventional magnetic storage devices include a magnetic transducer or "head" suspended in close proximity to a recording medium, for example a magnetic disk, having a plurality of concentric tracks. The transducer is supported by an air-bearing slider mounted to a flexible suspension. The suspension, in turn, is attached to a positioning actuator. During normal operation, relative motion is provided between the head and the recording medium as the actuator dynamically positions the head over the desired track. The relative movement provides an air flow along the surface of the slider facing the medium, creating a lifting force. The lifting force is counterbalanced by a predetermined suspension load so that the slider is supported on a cushion of air. Air flow enters the "leading" end of the slider and exits from the "trailing" end. This air is used to prevent the head from contacting the disk, resulting in damage.

Writing data is typically performed by applying a current to the coil of the head so that a magnetic field is induced in an adjacent magnetic permeable core, with the core transmitting a magnetic signal across any spacing and protecting coating of the disk to magnetize a small pattern or digital bit of the medium within the disk. Reading of the information in the disk is performed by sensing the change in magnetic field of the core as the transducer passes over the bits in the disk. The changing magnetic field induces a voltage or current in the inductively coupled coil. Alternatively, reading of the information may be accomplished by employing a magneto-resistive (MR) sensor, which has a resistance that varies as a function of the magnetic field adjacent to the sensor. In order to increase the amplitude and resolution in reading the bits, the MR sensor is typically positioned on the slider as close to the disk as possible. Connected to these heads or sensors are read circuits which amplify the recorded data and eliminate noise. However, recently, some manufacturers of these MR sensors have switched from MR heads which employ a constant current source to MR heads which employ a constant voltage source. Consequently, there is a need for a read circuit which provides a constant voltage source instead of a constant current source. Thus, a constant voltage source would be desirable to be placed directly across the $R_{MR}$, namely the resistance of the MR head. This aspect is especially true in that a need is required for a differential read circuit which provides a constant voltage source.

SUMMARY OF THE INVENTION

The present invention includes a constant voltage circuit which reads information from a head and which provides a constant voltage source for a differential amplifier. This constant voltage source is used instead of a constant current source and, consequently, the constant voltage source is placed directly across the resistance of the magneto-resistive sensor. Additionally, it is desirable to have such a constant voltage circuit which uses a feedback loop in order to provide the constant voltage. This feedback loop should be programmable so that different target values for the voltage drop across the resistance is achievable.

DETAILED DESCRIPTION OF THE PRESENT INVENTION

The following invention is described with reference to figures in which similar or the same numbers represent the same or similar elements. While the invention is described in terms for achieving the invention's objectives, it can be appreciated by those skilled in the art that variations may be accomplished in view of these teachings without deviation from the spirit or scope of the invention.

Figure 2:
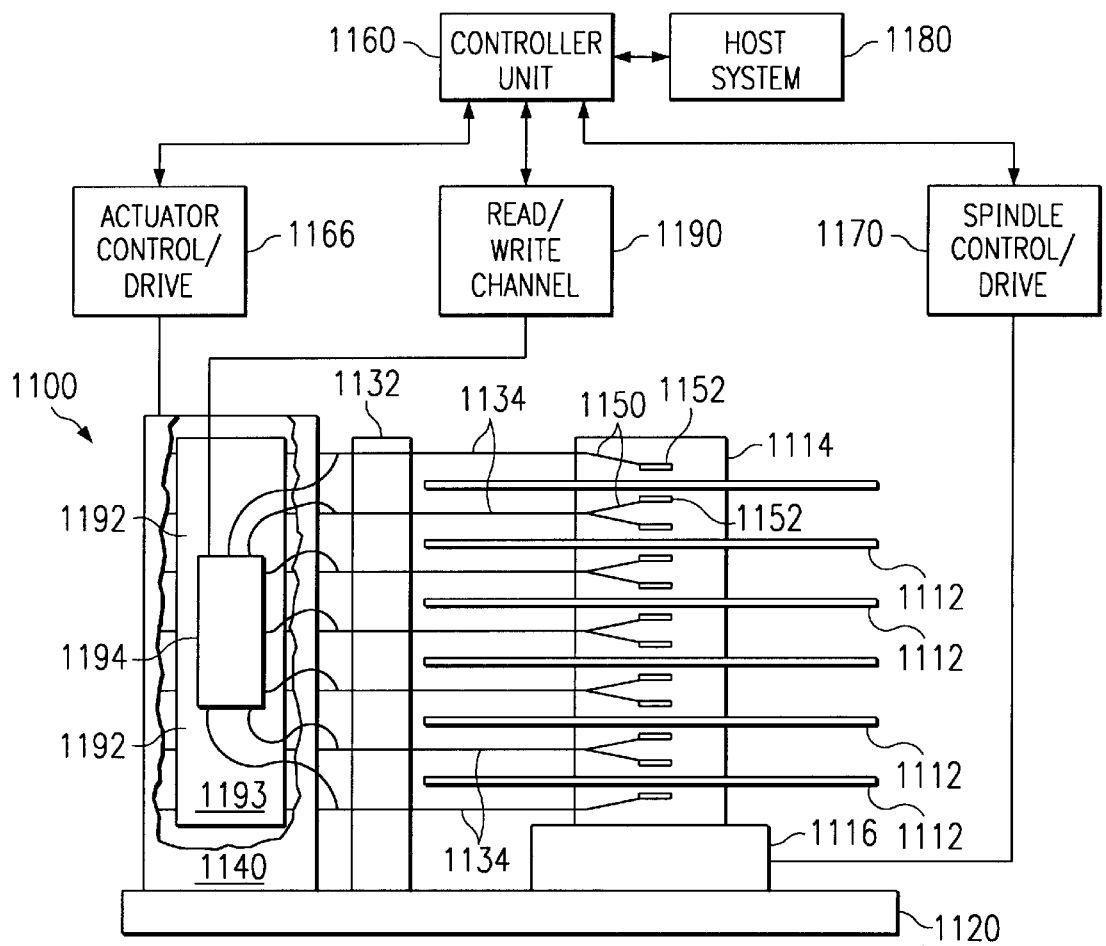
FIG. 2 is a side view of a disk drive system.
Figure 3:
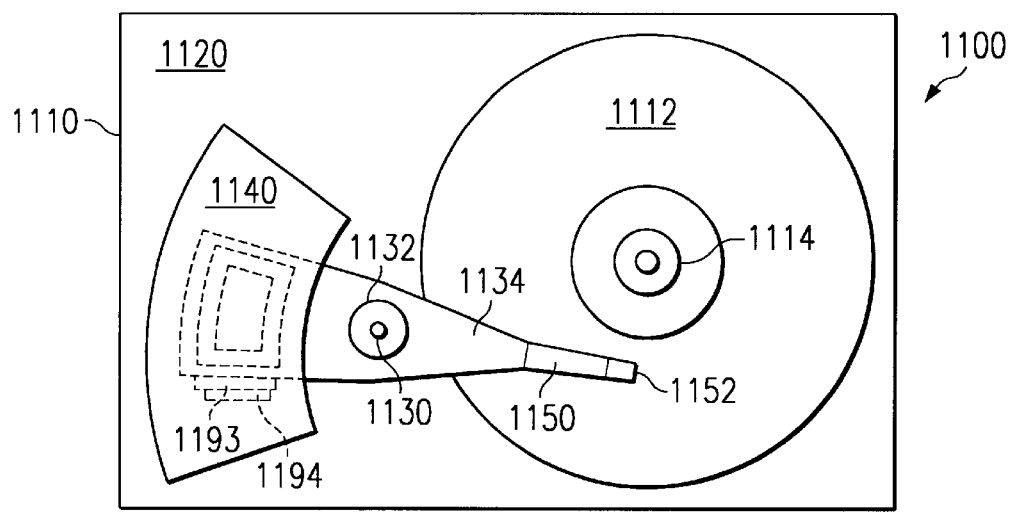
FIG. 3 is a top view of a disk drive system.

FIGS. 2 and 3 show a side and top view, respectively, of the disk drive system designated by the general reference 1100 within an enclosure 1110. The disk drive system 1100 includes a plurality of stacked magnetic recording disks 1112 mounted to a spindle 1114. The disks 1112 may be conventional particulate or thin film recording disk or, in other embodiments, they may be liquid-bearing disks. The spindle 1114 is attached to a spindle motor 1116 which rotates the spindle 1114 and disks 1112. A chassis 1120 is connected to the enclosure 1110, providing stable mechanical support for the disk drive system. The spindle motor 1116 and the actuator shaft 1130 are attached to the chassis 1120. A hub assembly 1132 rotates about the actuator shaft 1130 and supports a plurality of actuator arms 1134. The stack of actuator arms 1134 is sometimes referred to as a "comb." A rotary voice coil motor 1140 is attached to chassis 1120 and to a rear portion of the actuator arms 1134.

A plurality of head suspension assemblies 1150 are attached to the actuator arms 1134. A plurality of inductive transducer heads 1152 are attached respectively to the suspension assemblies 1150, each head 1152 including at least one inductive write element. In addition thereto, each head 1152 may also include an inductive read element or a MR (magneto-resistive) read element. The heads 1152 are positioned proximate to the disks 1112 by the suspension assemblies 1150 so that during operation, the heads are in electromagnetic communication with the disks 1112. The rotary voice coil motor 1140 rotates the actuator arms 1134 about the actuator shaft 1130 in order to move the head suspension assemblies 1150 to the desired radial position on disks 1112.

A controller unit 1160 provides overall control to the disk drive system 1100, including rotation control of the disks 1112 and position control of the heads 1152. The controller unit 1160 typically includes (not shown) a central processing unit (CPU), a memory unit and other digital circuitry, although it should be apparent that these aspects could also be enabled as hardware logic by one skilled in the computer arts. Controller unit 1160 is connected to the actuator control/drive unit 1166 which is in turn connected to the rotary voice coil motor 1140. A host system 1180, typically a computer system or personal computer (PC), is connected to the controller unit 1160. The host system 1180 may send digital data to the controller unit 1160 to be stored on the disks, or it may request that digital data at a specified location be read from the disks 1112 and sent back to the host system 1180. A read/write channel 1190 is coupled to receive and condition read and write signals generated by the controller unit 1160 and communicate them to an arm electronics (AE) unit shown generally at 1192 through a cut-away portion of the voice coil motor 1140. The read/ write channel 1190 includes the phase lock loop of the present invention. The AE unit 1192 includes a printed circuit board 1193, or a flexible carrier, mounted on the actuator arms 1134 or in close proximity thereto, and an AE module 1194 mounted on the printed circuit board 1193 or carrier that comprises circuitry preferably implemented in an integrated circuit (IC) chip including read drivers, write drivers, and associated control circuitry. The AE module 1194 is coupled via connections in the printed circuit board to the read/write channel 1190 and also to each read head and each write head in the plurality of heads 1152. The AE module 1194 includes the read circuit of the present invention.

Figure 1:
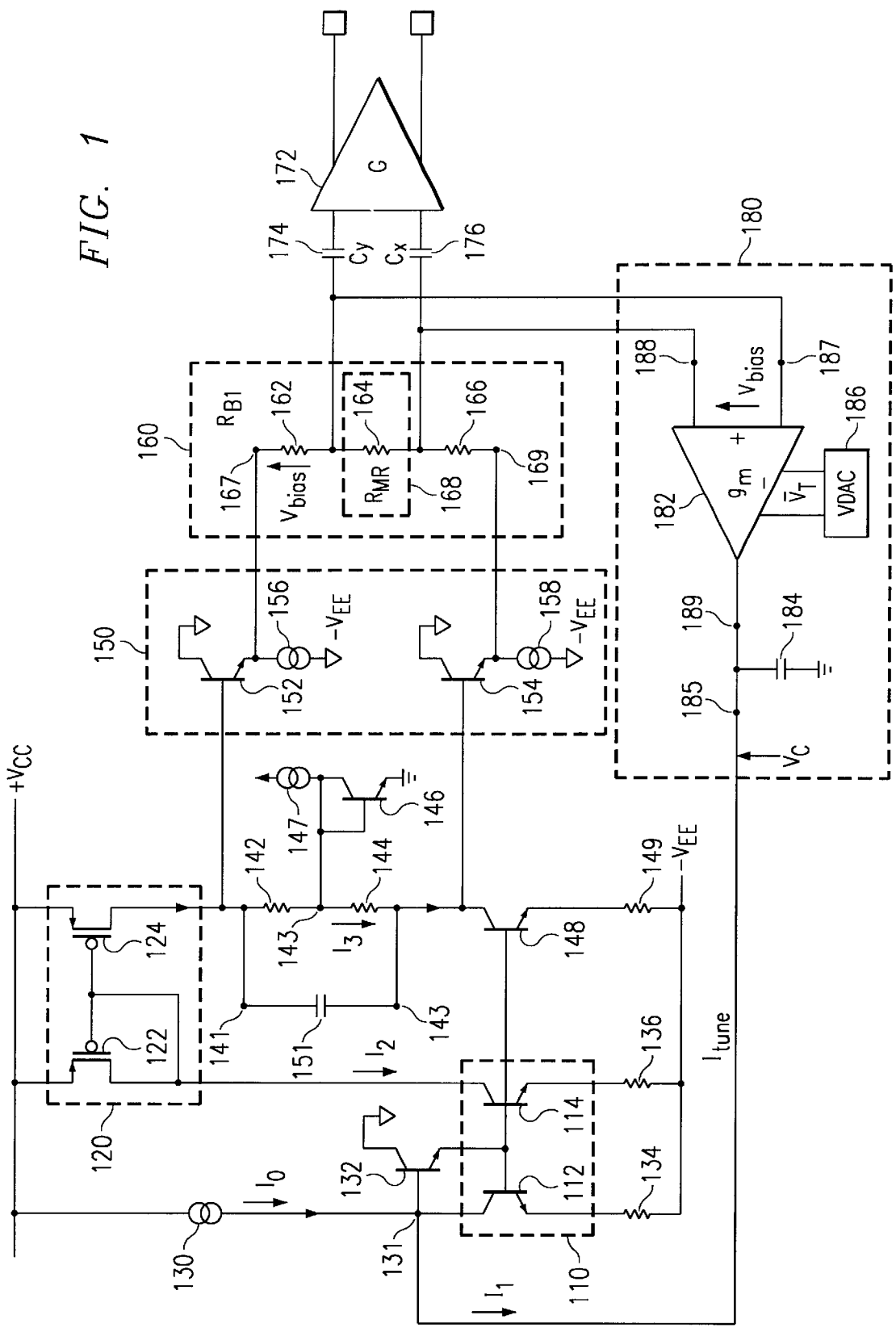
FIG. 1 illustrates a circuit in accordance with the teachings of the present invention.

FIG. 1 illustrates a constant voltage circuit for providing a constant voltage $V_{BIAS}$ across the read head to be used in the disk drive system. The present invention provides this constant voltage to a differential output circuit. The constant voltage circuit to produce a differential current output is illustrated in FIG. 1. This constant voltage circuit includes a first current path through transistor 112 and current generator 130, a second current path through transistor 114 and through transistor 122, and a third current path through FET 124, resistor 142, resistor 144, transistor 148 and resistor 149. In addition, the constant voltage circuit, as illustrated in FIG. 1, includes a voltage reduction circuit 160, a voltage dividing circuit 150, a feedback circuit 180, a current mirror circuit 110, and a second current mirror circuit 120. The first current path includes a current generating circuit 130 to generate a current $I_0$ to flow in a portion of the first current path. In addition, current generator 130 is connected to voltage $V_{CC}$ and connected to the base of transistor 132 and to the collector of transistor 112. Additionally, the first current path includes the transistor 112 and resistor 134. The second current path includes FET device 122 which is a PFET device having a source connected to voltage $V_{CC}$, a gate connected to the drain of PFET 122. The current $I_2$ flows along the second current path and through the collector to emitter of transistor 114 and through resistor 136. In addition, the circuit illustrates a third current path including a FET 124 being illustrated as a PFET device with a source connected to voltage $V_{CC}$, the gate connected to the gate of PFET 122 and the drain of PFET 120 being connected to capacitor 151 and resistor 142. The resistor 142 is additionally connected to resistor 144, and the other end of resistor 144 is connected to another end of capacitor 151. Both capacitor 151 and resistor 144 are connected to the collector of transistor 148. The emitter of transistor 148 is connected to resistor 149. The other end of resistor 149 is connected to voltage $V_{EE}$, for example a negative 5V supply.

Connected to the collector of transistor 112 is the base of transistor 132. The collector of transistor 132 is connected to voltage $V_{CC}$ with the emitter of transistor 132 being connected to the bases of transistor 112 and transistor 114. Additionally, transistor 146 is connected between resistors 142 and 146. More particularly, the base and collector of transistor 146 is connected between resistors 142 and 140. The emitter of transistor 146 is connected to ground. The collector and base of transistor 146 is connected to current generator 147. The current generator generates a small amount, in this example 100 µA, of current so that the transistor 146 is biased to produce a voltage drop, in this example $1V_{BE}$, with respect to ground. The voltage driver circuit 150 reduces the common mode voltage by $1V_{BE}$ at the terminal between resistor 142 and PFET 120 and at the terminal between resistor 144 and transistor 148. The collector of transistor 152 is connected to voltage $V_{CC}$. Likewise, with transistor 154, the base is connected at the terminal between transistor 148 and resistor 144. The collector of transistor 154 is connected to voltage GND. The base of transistor 154 is connected to a current generator. Additionally, the base is connected to resistor 166. The current generator 156 and 158 operate to bias the transistors 154 and 152, respectively, such that the base-to-emitter voltage of the respective transistors 152 and 154 is $1V_{BE}$. The resistor 162 is connected to the emitter of transistor 152. The resistance 162 is connected to the head 168 of the disk drive system. The head 168 includes a resistor 164, representing the resistance of the head, connected to the resistor 162. The resistor 164 is connected to resistor 166, and the other end of resistor 166 is connected to the emitter of transistor 154. Additionally, the capacitor 174 is connected between resistor 164 and resistor 162. The capacitor 176 is connected between resistor 164 and resistor 160. The capacitors 174 and 176 are decoupling capacitors to decouple the DC bias from the read head. The capacitors 174 and 176 are connected to amplifier 172 which amplifies the signal for the read channel. The feedback circuit 180 includes a negative input 187 to transconductance circuit 182 connected to the read head 168 between resistor 162 and resistor 164, and the positive input 188 to transconductance circuit 182. Thus, between the input terminals 187 and 188, the voltage $V_{BIAS}$ across the read head 168 appears. This $V_{BIAS}$ signal is input to transconductance circuit 182. The transconductance circuit compares the $V_{BIAS}$ signal across terminals 187 and 188 with a target voltage such as voltage $V_{DAC}$ output from VDAC circuit 186. If there is a difference between voltage $V_{BIAS}$ and voltage $V_{DAC}$, an output signal from transconductance circuit 182 is output to terminal 189. The output signal is current $I_{TUNE}$. This output current is proportional to the difference in voltage between $V_{BIAS}$ and the target voltage output from VDAC circuit 186. The capacitor 184 is connected between ground and the output of transconductance circuit 182. This capacitor 184 eliminates any fast fluctuations from the output signal, current $I_{TUNE}$. The output of transconductance circuit 182 is connected to the base of transistor 132.

In operation, current $I_0$ flows through a first portion of the first current path and is output from current generator 130. In addition, current $I_{TUNE}$ is input to node 131 to form current $I_1$ which flows from the collector to the emitter of transistor 112 and through resistor 134. This current $I_1$ is mirrored by current mirror circuit 110 to the second current path, and the mirrored current is illustrated in FIG. 1 as $I_2$. This current $I_2$ is mirrored to the third current path by current mirror circuit 120. This current is illustrated in FIG. 1 as current $I_3$, which flows in the third current path, which flows through resistor 142, resistor 144 and transistor 148. The current $I_3$ flows through resistors 142 and 144 to form a voltage between terminals 141 and 143. The voltage $V_{CN}$ is equal to $I_3 \times (R_{142} + R_{143})$. Since $I_3$ is equal to $I_0 + I_{TUNE}$, $$V_{CN} = I_0 + I_{TUNE} \times (R_1 + R_2) \quad (1)$$

Typically, the resistance value of resistor 142 and the resistance value of resistor 144 are the same. The transistor 146 is connected with an emitter-to-ground connection to establish the center of head 168 is at ground potential. Node 143 will be at $1V_{BE}$ above ground as a result of transistor 146. Thus, the voltage at terminal 141 and the voltage at terminal 143 are at $1V_{BE}$ above ground since the resistance of resistor 142 is equal to the resistance of resistor 144.

The voltage during circuit 150 reduces the voltage of voltage $V_{CN}$ by one $V_{BE}$. More particularly, the transistor 152 reduces the voltage at terminal 141 by one $V_{BE}$, and the transistor 154 reduces the voltage at terminal 143 by one $V_{BE}$. As a consequence, the voltage across terminals 162 and 169 are the same voltage as the voltage across terminals 141 and 143. In addition, the center of the head 168 is at ground potential. The current through resistors 162, 164 and 166 is determined by equation 2.

$$I_{MR} = \frac{V_{CN}}{R_{162} + R_{164} + R_{166}} \quad (2)$$

Therefore, the voltage across the head $V_{BIAS}$ equals equation 3.

$$V_{BIAS} = I_{MR} \times R_{168} \quad (3)$$

Thus, the voltage across the head 168 is maintained by the current $I_1$ which is equal to $I_0 + I_{TUNE}$. When deviations occur in the voltage, namely $V_{BIAS}$, it is sensed by the transconductance circuit 132 as a deviation from the target voltage. The target voltage is programmable by the $V_{DAC}$ 186. Once a deviation has occurred, the current $I_{TUNE}$ changes to provide an indication of the magnitude of the change. For example, if the voltage across the head 168 increases, the current $I_{TUNE}$ decreases, decreasing the current $I_1$ through the first current path. As $I_1$ decreases, the current $I_2$ decreases as a result of the current mirror action of current mirror 110. Additionally, as the current $I_2$ decreases, the current $I_3$ decreases as a result of the current mirror 120. As a result of the voltage IR drop, the voltage drop across resistors 142 and 144 decreases, resulting in the decrease in voltage from terminal 141 to terminal 143. Consequently, the voltage across terminals 162 and 169 decreases, and the current through the head decreases as a result of the IR drop across the resistance from resistor 162, resistor 164 and resistor 168. Thus, the voltage drop across the head decreases because the current has decreased and the corresponding IR drop across resistor 168 decreases. This stabilizes when the voltage across the head 168 reaches the target value. The gain circuit 172 amplifies the differential data from the head 168.

What is claimed is:

1. A differential circuit to read differential data from a disk by a voltage bias on a read head, comprising:
   a read circuit to read said differential data from said disk by maintaining said voltage bias on said read head; and
   a feedback circuit to sense deviations in said voltage and to adjust said voltage in response to said deviations.

2. A differential circuit, as in claim 1, wherein said feedback circuit includes a transconductance circuit.

3. A differential circuit, as in claim 2, wherein said transconductance circuit measures said deviations with respect to a target voltage.

4. A differential circuit, as in claim 3, wherein said target voltage is programmable.

5. A differential circuit, as in claim 1, wherein aid feedback circuit provides feedback by adjusting a current in accordance with said deviations.

6. A differential circuit, as in claim 5, wherein said current is transmitted by a current mirror circuit.

7. A differential circuit, as in claim 1, wherein a center of said head is at ground potential.

8. A disk system to read information from a disk, comprising:
   a read/write head to read and write information from said disk;
   a read channel to process said information; and
   a differential circuit to read differential data from a disk by a voltage bias, comprising:
      a read circuit to read said differential data from said disk by maintaining said voltage; and
      a feedback circuit to sense deviations in said voltage and to adjust said voltage in response to said deviations.

9. A disk system, as in claim 8, wherein said feedback circuit includes a transconductance circuit.

10. A disk system, as in claim 9, wherein said transconductance circuit measures said deviations with respect to a target voltage.

11. A disk system, as in claim 10, wherein said target voltage is programmable.

12. A disk system, as in claim 8, wherein said feedback circuit provides feedback by adjusting a current in accordance with said deviations.

13. A disk system, as in claim 11, wherein said current is transmitted by a current mirror circuit.

14. A disk system, as in claim 8, wherein a center of said head is at ground potential.

* * * * *